(12) United States Patent
Lee et al.

(10) Patent No.: US 12,382,199 B2
(45) Date of Patent: Aug. 5, 2025

(54) IMAGE SENSOR AND OPERATING METHOD THEREOF

(71) Applicant: SK hynix Inc., Gyeonggi-do (KR)

(72) Inventors: Sun Young Lee, Gyeonggi-do (KR); Jeong Eun Song, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 147 days.

(21) Appl. No.: 18/465,993

(22) Filed: Sep. 13, 2023

(65) Prior Publication Data

US 2024/0323568 A1 Sep. 26, 2024

(30) Foreign Application Priority Data

Mar. 24, 2023 (KR) .................. 10-2023-0038712

(51) Int. Cl.
*H04N 25/772* (2023.01)
*H03M 1/34* (2006.01)

(52) U.S. Cl.
CPC ............ *H04N 25/772* (2023.01); *H03M 1/34* (2013.01)

(58) Field of Classification Search
CPC .............................. H04N 25/772; H03M 1/34
USPC .................................................... 348/207.99
See application file for complete search history.

(56) References Cited

U.S. PATENT DOCUMENTS 9,723,241 B2  8/2017 Yeh et al.
2023/0412948 A1* 12/2023 Lee ...................... G01S 17/894

FOREIGN PATENT DOCUMENTS

KR  10-2019-0020408 A  3/2019
KR  10-2022-0141624 A  10/2022

* cited by examiner

*Primary Examiner* — Joel W Fosselman
(74) *Attorney, Agent, or Firm* — IP & T GROUP LLP

(57) ABSTRACT

Disclosed is an image sensor including first and second pixels arranged in a first row, for outputting first and second pixel signals through first and third column lines during a unit row time; third and fourth pixels arranged in a second row, for outputting third and fourth pixel signals through second and fourth column lines during the unit row time; an alignment circuit for aligning the first to fourth pixel signals for each row, and outputting first to fourth alignment signals, according to control signals; a first signal conversion circuit for generating a first depth information signal corresponding to a difference in voltage levels between the first and second alignment signals, through one A/D conversion operation; and a second signal conversion circuit for generating a second depth information signal, corresponding to a difference in voltage levels between the third and fourth alignment signals, through one A/D conversion operation.

20 Claims, 8 Drawing Sheets

IMAGE SENSOR AND OPERATING METHOD THEREOF

CROSS-REFERENCE TO RELATED APPLICATION(S)

This application claims priority under 35 U.S.C. § 119 to Korean Patent Application No. 10-2023-0038712, filed on Mar. 24, 2023, the disclosure of which is incorporated herein by reference in its entirety.

BACKGROUND

1. Field

Various embodiments of the present disclosure relate to a semiconductor design technique, and more particularly, to an image sensor and an operating method thereof.

2. Description of the Related Art

Image sensors are devices for capturing images using the property of a semiconductor which reacts to light. Image sensors may be roughly classified into charge-coupled device (CCD) image sensors and complementary metal-oxide semiconductor (CMOS) image sensors. Recently, CMOS image sensors are widely used because the CMOS image sensor can allow both analog and digital control circuits to be directly implemented on a single integrated circuit (IC).

The background technology of the present disclosure is disclosed in Korean Patent Application Laid-Open No. 10-2022-0141624 published on Oct. 20, 2022 and entitled "IMAGE SENSING DEVICE".

SUMMARY

Various embodiments of the present disclosure are directed to an image sensor capable of simultaneously reading out a plurality of pixel signals from a plurality of rows in a structure in which the plurality of pixel signals are converted into a single depth information signal through one analog-to-digital (A/D) conversion operation, and an operating method of the image sensor.

In accordance with an embodiment of the present disclosure, an image sensor may include: first and second pixels arranged in a first row, and suitable for outputting first and second pixel signals through first and third column lines, respectively, during a unit row time; third and fourth pixels arranged in a second row different from the first row, and suitable for outputting third and fourth pixel signals through second and fourth column lines, respectively, during the unit row time; an alignment circuit suitable for aligning the first to fourth pixel signals for each of the first and second rows, and outputting first to fourth alignment signals, according to a plurality of control signals; a first signal conversion circuit suitable for receiving the first and second alignment signals and generating a first depth information signal, which corresponds to a difference in voltage levels between the first and second alignment signals, through one analog-to-digital (A/D) conversion operation; and a second signal conversion circuit suitable for receiving the third and fourth alignment signals and generating a second depth information signal, which corresponds to a difference in voltage levels between the third and fourth alignment signals, through one A/D conversion operation.

In accordance with an embodiment of the present disclosure, an operating method of an image sensor including first to fourth pixels arranged between first to fourth column lines sequentially arranged along a row direction, and first to fourth switches sequentially arranged along the row direction, the operating method may include: outputting, by the second switch, a second pixel signal, which is outputted through the third column line, to a first output node, and outputting, by the fourth switch, a fourth pixel signal, which is outputted through the fourth column line, to a second output node, during an auto-zeroing period of a unit row time; and outputting, by the first switch, a first pixel signal, which is outputted through the first column line, to the first output node, and outputting, by the third switch, a third pixel signal, which is outputted through the second column line, to the second output node, during a conversion period of the unit row time.

In accordance with an embodiment of the present disclosure, an system may include: an object; an image sensor optically coupled to the object and suitable for generating first to fourth depth information signals indicating a distance from the object, wherein the image sensor includes: a pixel array including first to fourth pixels arranged between first and second rows and first to fourth columns, wherein the first and second pixels are arranged between the first row and the first and third columns and output first and second pixel signals through the first and third column lines, respectively, and wherein the third and fourth pixels are arranged between the second row and the second and fourth columns and output third and fourth pixel signals through the second and fourth column lines, respectively; an alignment circuit suitable for aligning the first to fourth pixel signals based on each of the first and second rows, generating first to fourth alignment signals corresponding to the first to fourth pixel signals, respectively, outputting the second and fourth alignment signals in a first period, and outputting the first and third alignment signals in a second period after the first period; a first signal conversion circuit suitable for receiving the first and second alignment signals, and converting the first and second alignment signals to generate a first depth information signal, which corresponds to a difference in voltage levels between the first and second alignment signals; and a second signal conversion circuit suitable for receiving the third and fourth alignment signals and converting the third and fourth alignment signals to generate a second depth information signal, which corresponds to a difference in voltage levels between the third and fourth alignment signals.

DETAILED DESCRIPTION

Various embodiments of the present disclosure are described below with reference to the accompanying drawings, in order to describe in detail the present disclosure so that those with ordinary skill in art to which the present disclosure pertains may easily carry out the technical spirit of the present disclosure.

It will be understood that when an element is referred to as being "connected to" or "coupled to" another element, the element may be directly connected to or coupled to the another element, or electrically connected to or coupled to the another element with one or more elements interposed therebetween. In addition, it will also be understood that the terms "comprises," "comprising," "includes," and "including" when used in this specification do not preclude the presence of one or more other elements, but may further include or have the one or more other elements, unless otherwise mentioned. In the description throughout the specification, some components are described in singular forms, but the present disclosure is not limited thereto, and it will be understood that the components may be formed in plural.

Figure 1:
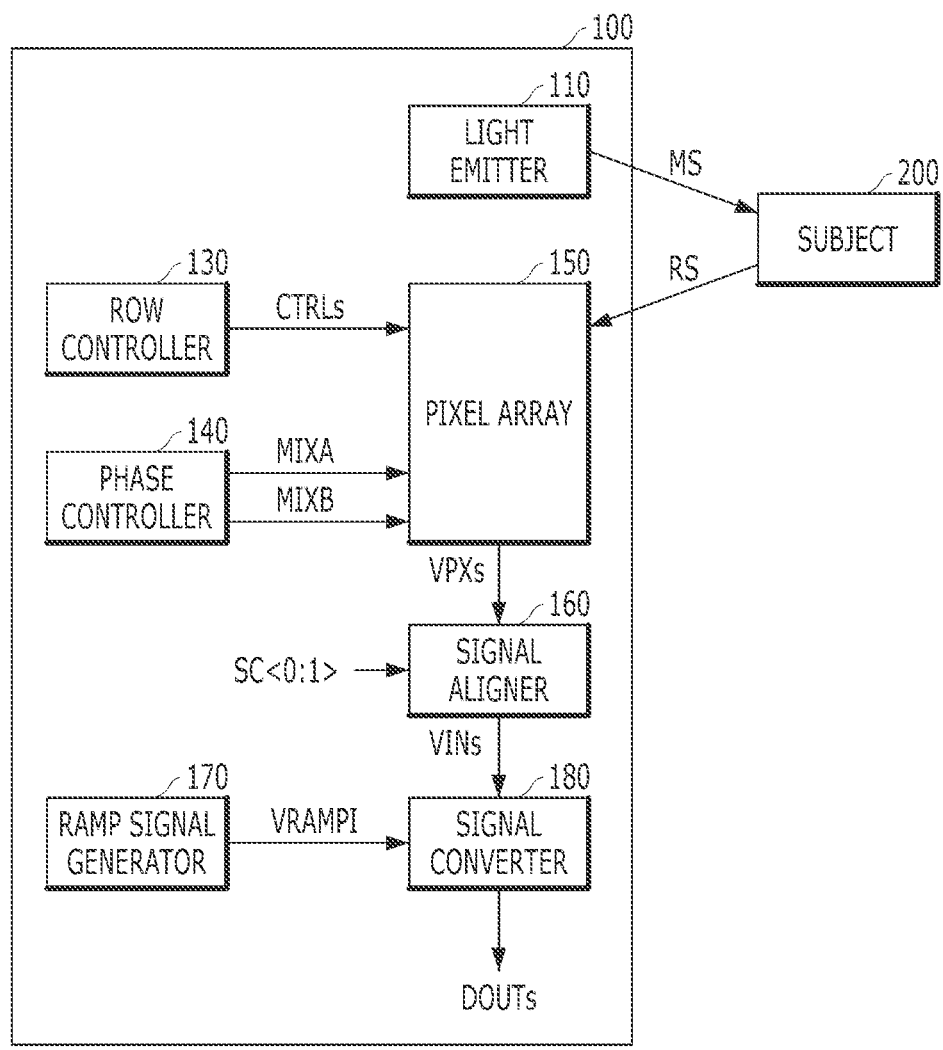
FIG. 1 is a block diagram illustrating an image sensor in accordance with an embodiment of the present disclosure.

FIG. 1 is a block diagram illustrating an image sensor 100 in accordance with an embodiment of the present disclosure.

Referring to FIG. 1, the image sensor 100 may generate depth information signals DOUTs indicating its distance from a subject 200, i.e., depth, by using a time of flight (TOF) method. For example, the image sensor 100 may generate the depth information signals DOUTs by detecting a phase difference between a first light signal MS that is outputted to the subject 200 and a second light signal RS that is reflected from the subject 200.

The image sensor 100 may include a light emitter 110, a row controller 130, a phase controller 140, a pixel array 150, a signal aligner 160, a ramp signal generator 170, and a signal converter 180.

The light emitter 110 may output the first light signal MS to the subject 200. For example, the first light signal MS may be a periodic signal that periodically toggles. The first light signal MS may be reflected from the subject 200, and be inputted to the pixel array 150 as the second light signal RS.

The row controller 130 may generate a plurality of row control signals CTRLs for controlling the pixel array 150 for each row. For example, the row controller 130 may generate first row control signals for controlling pixels arranged in a first row of the pixel array 150, and generate kth row control signals for controlling pixels arranged in a kth row of the pixel array 150, where "k" is a natural number greater than 2.

The phase controller 140 may generate first and second control signals MIXA and MIXB having different phases. For example, the first and second control signals MIXA and MIXB may have a phase difference of 180 degrees with respect to each other. The first and second control signals MIXA and MIXB may have the same period as the first light signal MS, and any of the first and second control signals MIXA and MIXB may have the same phase as the first light signal MS.

The pixel array 150 may receive the second light signal RS, the plurality of row control signals CTRLs, and the first and second control signals MIXA and MIXB, and generate a plurality of pixel signals VPXs. The pixel array 150 may receive background light together with the second light signal RS. The pixel array 150 may include a plurality of pixel pairs for measuring the depth from the subject 200. For example, the plurality of pixel pairs may be selected based on the plurality of row control signals CTRLs, and generate first and second pixel signals among the plurality of pixel signals VPXs on the basis of the first and second control signals MIXA and MIXB and the second light signal RS. The plurality of pixel pairs are described in more detail with reference to FIG. 2.

The signal aligner 160 may generate a plurality of target signals VINs, which are aligned for each row, on the basis of first and second control signals SC<0:1> and the plurality of pixel signals VPXs.

The ramp signal generator 170 may generate a reference ramp signal VRAMPI.

The signal converter 180 may generate the plurality of depth information signals DOUTs on the basis of the reference ramp signal VRAMPI and the plurality of target signals VINs. For example, the signal converter 180 may generate the depth information signals DOUTs corresponding to a difference in voltage levels between the first and second pixel signals through one analog-to-digital (A/D) conversion operation.

Figure 2:
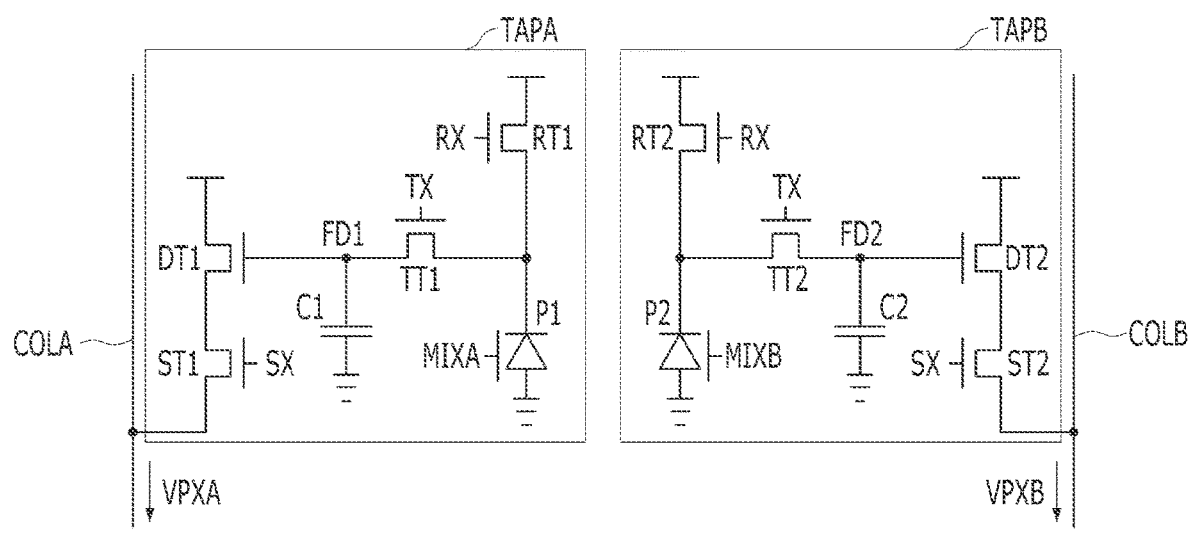
FIG. 2 is a circuit diagram illustrating a pair of pixels of a pixel array illustrated in FIG. 1.

FIG. 2 is a circuit diagram illustrating a pair of pixels among the plurality of pixel pairs illustrated in FIG. 1.

Referring to FIG. 2, the pair of pixels may include a first pixel TAPA and a second pixel TAPB.

The first pixel TAPA may generate the first pixel signal VPXA on the basis of a reset signal RX, a transmission signal TX, a selection signal SX, and the first control signal MIXA. The reset signal RX, the transmission signal TX, and the selection signal SX may be signals included in the plurality of row control signals CTRLs described above. For example, the first pixel TAPA may include a first sensing circuit P1, a first transmission circuit TT1, a first charge storage circuit C1, a first reset circuit RT1, a first driving circuit DT1, and a first selection circuit ST1.

The first sensing circuit P1 may be coupled between the first transmission circuit TT1 and a low voltage terminal (i.e., a ground voltage terminal). The first sensing circuit P1 may generate first charges, which correspond to the second light signal RS and the background light, on the basis of the first control signal MIXA. For example, the first sensing circuit P1 may include a photodiode.

The first transmission circuit TT1 may be coupled between a first floating diffusion node FD1 and the first sensing circuit P1. The first transmission circuit TT1 may couple the first reset circuit RT1 to the first charge storage circuit C1 when the first charge storage circuit C1 is reset or transmit the first charges, which are generated by the first sensing circuit P1, to the first charge storage circuit C1, on the basis of the transmission signal TX. For example, the first transmission circuit TT1 may include an NMOS transistor.

The first charge storage circuit C1 may be coupled between the first floating diffusion node FD1 and the low voltage terminal. For example, the first charge storage circuit C1 may be a parasitic capacitor formed in the first floating diffusion node FD1.

The first reset circuit RT1 may be coupled between a first high voltage terminal and the first sensing circuit P1. The first reset circuit RT1 may reset the first sensing circuit P1 and the first charge storage circuit C1 on the basis of the reset signal RX. For example, the first reset circuit RT1 may include an NMOS transistor.

The first driving circuit DT1 may be coupled between a second high voltage terminal and the first selection circuit ST1. The second high voltage terminal may be the same as or different from the first high voltage terminal. The first driving circuit DT1 may drive a first column line COLA with a high voltage, which is supplied through the second high voltage terminal, on the basis of a voltage loaded on the first floating diffusion node FD1, and generate the first pixel signal VPXA through the first column line COLA. For example, the first driving circuit DT1 may include an NMOS transistor.

The first selection circuit ST1 may be coupled between the first driving circuit DT1 and the first column line COLA. The first selection circuit ST1 may selectively couple the first driving circuit DT1 to the first column line COLA on the basis of the selection signal SX. For example, the first selection circuit ST1 may include an NMOS transistor.

The second pixel TAPB may generate the second pixel signal VPXB on the basis of a reset signal RX, a transmission signal TX, a selection signal SX, and the second control signal MIXB. For example, the second pixel TAPB may include a second sensing circuit P2, a second transmission circuit TT2, a second charge storage circuit C2, a second reset circuit RT2, a second driving circuit DT2, and a second selection circuit ST2.

The second sensing circuit P2 may be coupled between the second transmission circuit TT2 and a low voltage terminal (e.g., a ground voltage terminal). The second sensing circuit P2 may generate second charges, which correspond to the second light signal RS and the background light, on the basis of the second control signal MIXB. For example, the second sensing circuit P2 may include a photodiode.

The second transmission circuit TT2 may be coupled between a second floating diffusion node FD2 and the second sensing circuit P2. The second transmission circuit TT2 may couple the second reset circuit RT2 to the second charge storage circuit C2 when the second charge storage circuit C2 is reset or transmit the second charges, which are generated by the second sensing circuit P2, to the second charge storage circuit C2, on the basis of the transmission signal TX. For example, the second transmission circuit TT2 may include an NMOS transistor.

The second charge storage circuit C2 may be coupled between the second floating diffusion node FD2 and the low voltage terminal. For example, the second charge storage circuit C2 may be a parasitic capacitor formed in the second floating diffusion node FD2.

The second reset circuit RT2 may be coupled between the first high voltage terminal and the second sensing circuit P2. The second reset circuit RT2 may reset the second sensing circuit P2 and the second charge storage circuit C2 on the basis of the reset signal RX. For example, the second reset circuit RT2 may include an NMOS transistor.

The second driving circuit DT2 may be coupled between the second high voltage terminal and the second selection circuit ST2. The second driving circuit DT2 may drive a second column line COLB with the high voltage, which is supplied through the second high voltage terminal, on the basis of a voltage loaded on the second floating diffusion node FD2, and generate the second pixel signal VPXB through the second column line COLB. For example, the second driving circuit DT2 may include an NMOS transistor.

The second selection circuit ST2 may be coupled between the second driving circuit DT2 and the second column line COLB. The second selection circuit ST2 may selectively couple the second driving circuit DT2 to the second column line COLB on the basis of the selection signal SX. For example, the second selection circuit ST2 may include an NMOS transistor.

Figure 3:
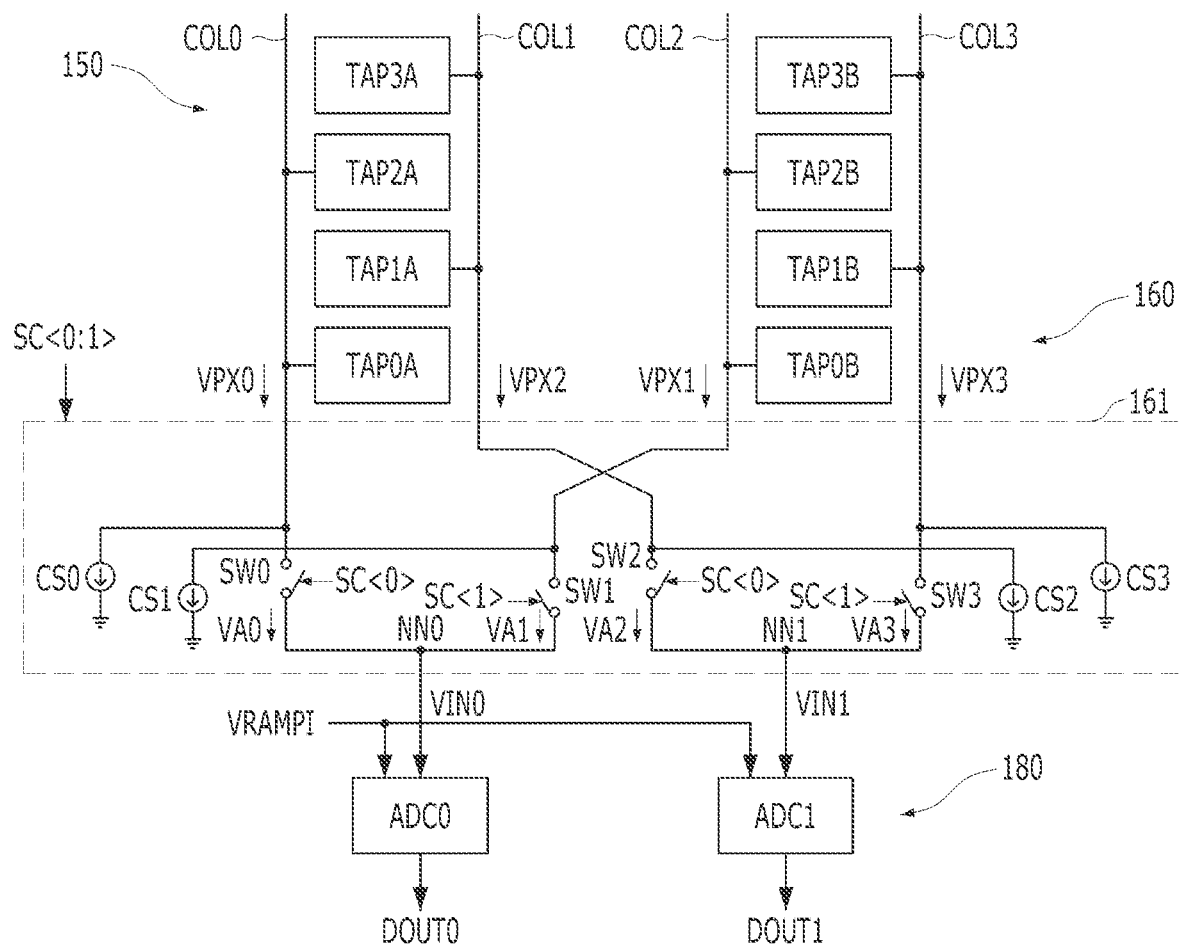
FIG. 3 is a block diagram illustrating an example of the pixel array, a signal aligner, and a signal converter illustrated in FIG. 1.

FIG. 3 is a block diagram illustrating an example of the pixel array 150, the signal aligner 160, and the signal converter 180 illustrated in FIG. 1.

Referring to FIG. 3, the pixel array 150 may include first and second pixels TAP0A and TAP0B arranged in the first row, third and fourth pixels TAP1A and TAP1B arranged in a second row, fifth and sixth pixels TAP2A and TAP2B arranged in a third row, and seventh and eighth pixels TAP3A and TAP3B arranged in a fourth row. The two pixels TAP0A/TAP0B, TAP1A/TAP1B, TAP2A/TAP2B, and TAP3A/TAP3B respectively arranged in the first to fourth rows may correspond to the pair of pixels illustrated in FIG. 2.

The first pixel TAP0A, the third pixel TAP1A, the fifth pixel TAP2A, and the seventh pixel TAP3A may be arranged in a first column. Among the pixels TAP0A, TAP1A, TAP2A, and TAP3A, the first pixel TAP0A and the fifth pixel TAP2A arranged in odd-numbered rows may be coupled to a first column line COL0, and the third pixel TAP1A and the seventh pixel TAP3A arranged in even-numbered rows may be coupled to a second column line COL1.

The second pixel TAP0B, the fourth pixel TAP1B, the sixth pixel TAP2B, and the eighth pixel TAP3B may be arranged in a second column. Among the pixels TAP0B, TAP1B, TAP2B, and TAP3B, the second pixel TAP0B and the sixth pixel TAP2B arranged in odd-numbered rows may be coupled to a third column line COL2, and the fourth pixel TAP1B and the eighth pixel TAP3B arranged in even-numbered rows may be coupled to a fourth column line COL3.

The first to fourth column lines COL0 to COL3 may extend in a column direction of the pixel array 150. The first to fourth column lines COL0 to COL3 may be sequentially arranged in a row direction.

The signal aligner 160 may include a first alignment circuit 161. The first alignment circuit 161 may align first to fourth pixel signals VPX0 to VPX3 for each row, and generate first to fourth alignment signals VA0 to VA3. For example, the first alignment circuit 161 may include first to fourth switches SW0 to SW3 and first to fourth current sources CS0 to CS3.

The first switch SW0 may be coupled between the first column line COL0 and a first output node NN0. The first switch SW0 may selectively couple the first column line COL0 to the first output node NN0 on the basis of the first control signal SC<0>. For example, the first switch SW0 may output the first alignment signal VA0 corresponding to the first pixel signal VPX0 to the first output node NN0 during a conversion period of a unit row time on the basis of the first control signal SC<0>.

The second switch SW1 may be coupled between the third column line COL2 and the first output node NN0. The second switch SW1 may selectively couple the third column line COL2 to the first output node NN0 on the basis of the second control signal SC<1>. For example, the second switch SW1 may output the second alignment signal VA1 corresponding to the second pixel signal VPX1 to the first output node NN0 during an auto-zeroing period of the unit row time on the basis of the second control signal SC<1>. The auto-zeroing period may be a previous period of the conversion period.

The third switch SW2 may be coupled between the second column line COL1 and a second output node NN1. The third switch SW2 may selectively couple the second column line COL1 to the second output node NN1 on the basis of the first control signal SC<0>. For example, the third switch SW2 may output the third alignment signal VA2 corresponding to the third pixel signal VPX2 to the second output node NN1 during the conversion period of the unit row time on the basis of the first control signal SC<0>.

The fourth switch SW3 may be coupled between the fourth column line COL3 and the second output node NN1. The fourth switch SW3 may selectively couple the fourth column line COL3 to the second output node NN1 on the basis of the second control signal SC<1>. For example, the fourth switch SW3 may output the fourth alignment signal VA3 corresponding to the fourth pixel signal VPX3 to the second output node NN1 during the auto-zeroing period of the unit row time on the basis of the second control signal SC<1>.

The first current source CS0 may be coupled between the first column line COL0 and the low voltage terminal. The first current source CS0 may be related to the first and fifth pixels TAP0A and TAP2A coupled to the first column line COL0, and generate a current necessary for reading out the first pixel signal VPX0.

The second current source CS1 may be coupled between the third column line COL2 and the low voltage terminal. The second current source CS1 may be related to the second and sixth pixels TAP0B and TAP2B coupled to the third column line COL2, and generate a current necessary for reading out the second pixel signal VPX1.

The third current source CS2 may be coupled between the second column line COL1 and the low voltage terminal. The third current source CS2 may be related to the third and seventh pixels TAP1A and TAP3A coupled to the second column line COL1, and generate a current necessary for reading out the third pixel signal VPX2.

The fourth current source CS3 may be coupled between the fourth column line COL3 and the low voltage terminal. The fourth current source CS3 may be related to the fourth and eighth pixels TAP1B and TAP3B coupled to the fourth column line COL3, and generate a current necessary for reading out the fourth pixel signal VPX3.

The signal converter 180 may include first and second signal conversion circuits ADC0 and ADC1.

The first signal conversion circuit ADC0 may generate a first depth information signal DOUT0 on the basis of the reference ramp signal VRAMPI and the first and second alignment signals VA0 and VA1. For example, the first signal conversion circuit ADC0 may generate a first target signal VIN0 corresponding to a difference in voltage levels between the first and second alignment signals VA0 and VA1, and generate the first depth information signal DOUT0 on the basis of the first target signal VIN0 and the reference ramp signal VRAMPI.

The second signal conversion circuit ADC1 may generate a second depth information signal DOUT1 on the basis of the reference ramp signal VRAMPI and the third and fourth alignment signals VA2 and VA3. For example, the second signal conversion circuit ADC1 may generate a second target signal VIN1 corresponding to a difference between the third and fourth alignment signals VA2 and VA3, and generate the second depth information signal DOUT1 on the basis of the second target signal VIN1 and the reference ramp signal VRAMPI.

Figure 4:
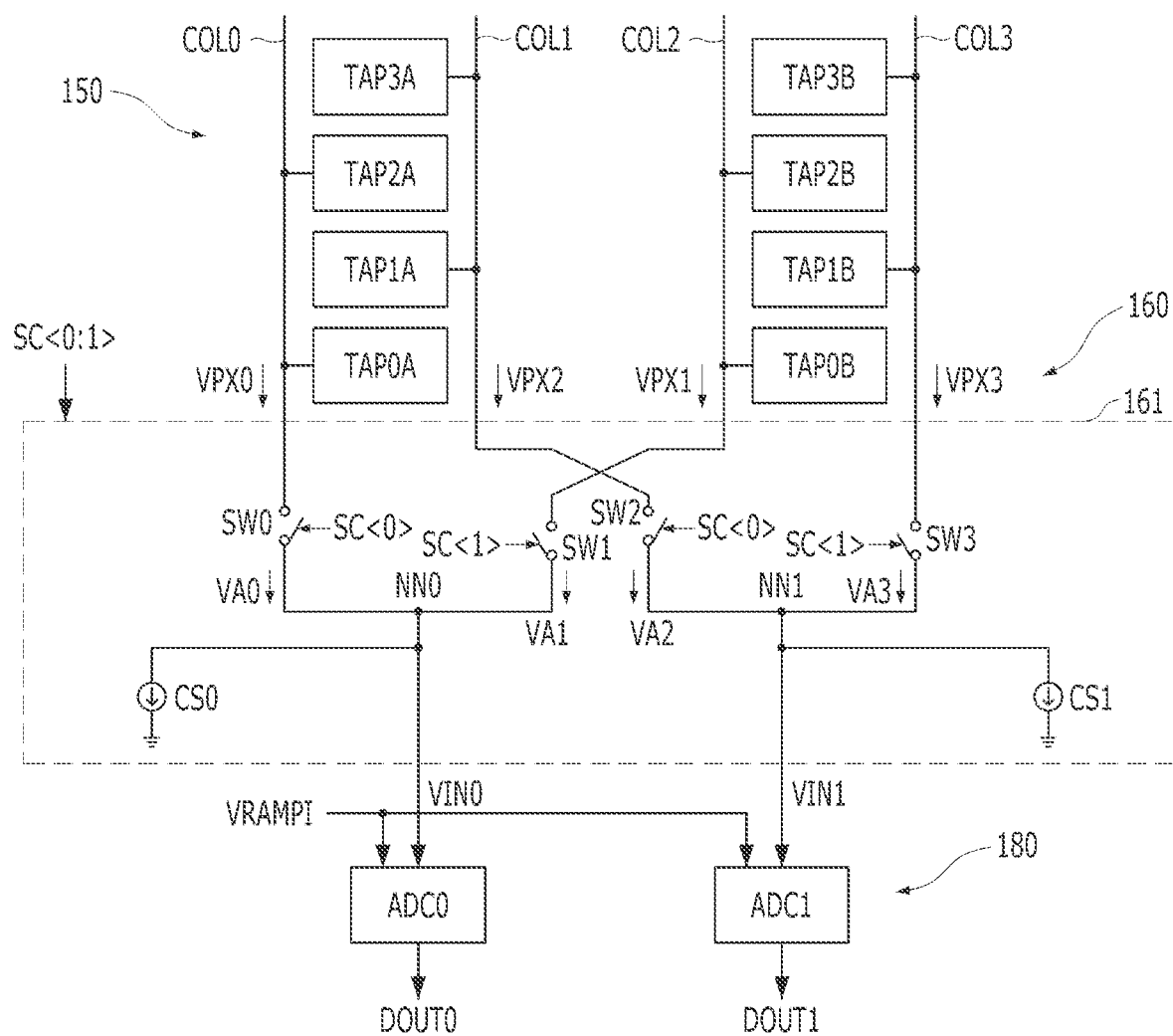
FIG. 4 is a block diagram illustrating another example of the pixel array, the signal aligner, and the signal converter illustrated in FIG. 1.

FIG. 4 is a block diagram illustrating another example of the pixel array 150, the signal aligner 160, and the signal converter 180 illustrated in FIG. 1.

Referring to FIG. 4, since the pixel array 150 and the signal converter 180 may have the same configurations as those illustrated in FIG. 3, detailed descriptions of the pixel array 150 and the signal converter 180 are omitted.

The signal aligner 160 may include a first alignment circuit 161. The first alignment circuit 161 may align first to fourth pixel signals VPX0 to VPX3 for each row, and generate first to fourth alignment signals VA0 to VA3. For example, the first alignment circuit 161 may include first to fourth switches SW0 to SW3 and first and second current sources CS0 and CS1.

The first switch SW0 may be coupled between the first column line COL0 and a first output node NN0. The first switch SW0 may selectively couple the first column line COL0 to the first output node NN0 on the basis of the first control signal SC<0>. For example, the first switch SW0 may output the first alignment signal VA0 corresponding to the first pixel signal VPX0 to the first output node NN0 during a conversion period of a unit row time on the basis of the first control signal SC<0>.

The second switch SW1 may be coupled between the third column line COL2 and the first output node NN0. The second switch SW1 may selectively couple the third column line COL2 to the first output node NN0 on the basis of the second control signal SC<1>. For example, the second switch SW1 may output the second alignment signal VA1 corresponding to the second pixel signal VPX1 to the first output node NN0 during an auto-zeroing period of the unit row time on the basis of the second control signal SC<1>. The auto-zeroing period may be a previous period of the conversion period.

The third switch SW2 may be coupled between the second column line COL1 and a second output node NN1. The third switch SW2 may selectively couple the second column line COL1 to the second output node NN1 on the basis of the first control signal SC<0>. For example, the third switch SW2 may output the third alignment signal VA2 corresponding to the third pixel signal VPX2 to the second output node NN1 during the conversion period of the unit row time on the basis of the first control signal SC<0>.

The fourth switch SW3 may be coupled between the fourth column line COL3 and the second output node NN1. The fourth switch SW3 may selectively couple the fourth column line COL3 to the second output node NN1 on the basis of the second control signal SC<1>. For example, the fourth switch SW3 may output the fourth alignment signal VA3 corresponding to the fourth pixel signal VPX3 to the second output node NN1 during the auto-zeroing period of the unit row time on the basis of the second control signal SC<1>.

The first current source CS0 may be coupled between the first output node NN0 and the low voltage terminal. The first current source CS0 may be related to the first and fifth pixels TAP0A and TAP2A coupled to the first column line COL0 and the second and sixth pixels TAP0B and TAP2B coupled to the third column line COL2, and generate a current necessary for reading out the first pixel signal VPX0 or the second pixel signal VPX1.

The second current source CS1 may be coupled between the second output node NN1 and the low voltage terminal. The second current source CS1 may be related to the third and seventh pixels TAP1A and TAP3A coupled to the second column line COL1 and the fourth and eighth pixels TAP1B and TAP3B coupled to the fourth column line COL3, and generate a current necessary for reading out the third pixel signal VPX2 or the fourth pixel signal VPX3.

Figure 5:
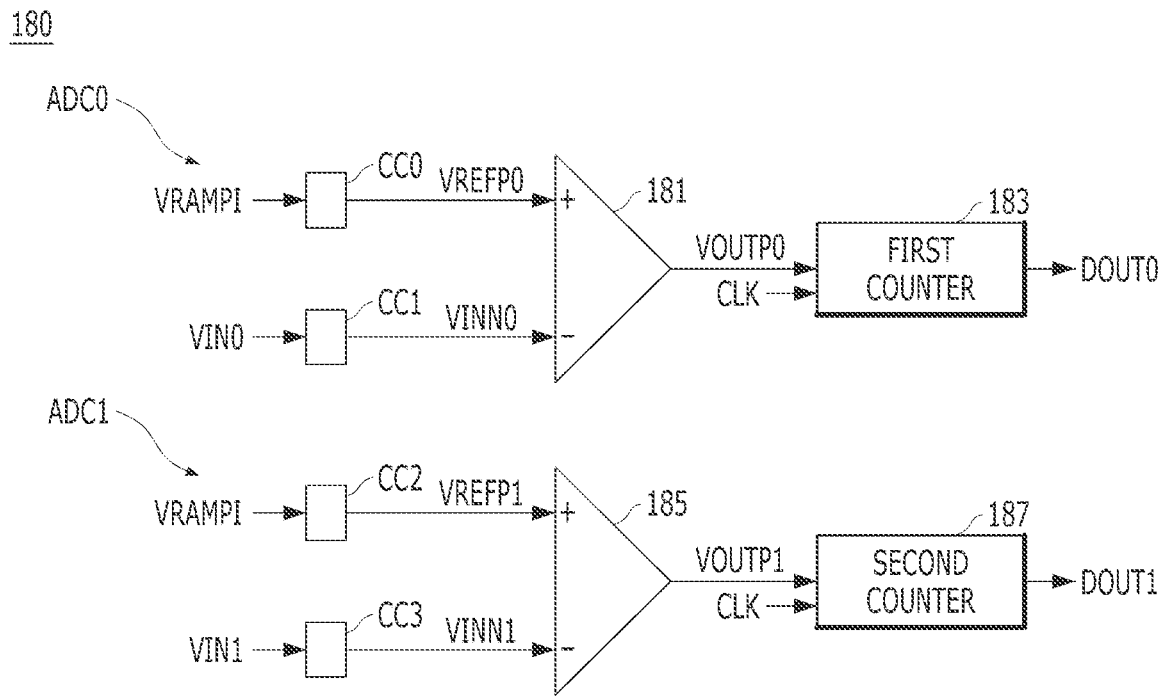
FIG. 5 is a block diagram illustrating an example of the signal converter illustrated in FIG. 1.

FIG. 5 is a block diagram illustrating an example of the signal converter 180 illustrated in FIG. 1. For example, FIG. 5 illustrates only configurations corresponding to the first and second signal conversion circuits ADC0 and ADC1 illustrated in each of FIGS. 3 and 4.

Referring to FIG. 5, the first signal conversion circuit ADC0 may include a first sampling element CC0, a second sampling element CC1, a first comparator 181, and a first counter 183.

The first sampling element CC0 may sample the reference ramp signal VRAMPI, and generate a first ramp signal VREFP0. For example, the first sampling element CC0 may include a capacitor.

The second sampling element CC1 may sample the first target signal VIN0, and output the sampled signal as a first measurement signal VINN0. For example, the second sampling element CC1 may include a capacitor.

The first comparator 181 may compare the first ramp signal VREFP0 with the first measurement signal VINN0, and output a first comparison signal VOUTP0 corresponding to a result of the comparison. For example, the first comparator 181 may generate the first comparison signal VOUTP0, which corresponds to the difference in voltage levels between the first and second pixel signals VPX0 and VPX1, through one comparison operation. The first comparator 181 may have a non-inverting input terminal (+) that receives the first ramp signal VREFP0, an inverting input terminal (−) that receives the first measurement signal VINN0, and an output terminal that outputs the first comparison signal VOUTP0. Although it is described as an example in the present embodiment that a comparator having a 2-input structure is included, the present disclosure is not necessarily limited thereto, and a comparator having a 4-input structure may be included.

The first counter 183 may generate a count signal, which corresponds to the difference in voltage levels between the first and second pixel signals VPX0 and VPX1, as the first depth information signal DOUT0 on the basis of the first comparison signal VOUTP0 and a clock signal CLK.

The second signal conversion circuit ADC1 may include a third sampling element CC2, a fourth sampling element CC3, a second comparator 185, and a second counter 187.

The third sampling element CC2 may sample the reference ramp signal VRAMPI, and generate a second ramp signal VREFP1. For example, the third sampling element CC2 may include a capacitor.

The fourth sampling element CC3 may sample the second target signal VIN1, and output the sampled signal as a second measurement signal VINN1. For example, the fourth sampling element CC3 may include a capacitor.

The second comparator 185 may compare the second ramp signal VREFP1 with the second measurement signal VINN1, and output a second comparison signal VOUTP1 corresponding to a result of the comparison. For example, the second comparator 185 may generate the second comparison signal VOUTP1, which corresponds to a difference in voltage levels between the third and fourth pixel signals VPX2 and VPX3, through one comparison operation. The second comparator 185 may have a non-inverting input terminal (+) that receives the second ramp signal VREFP1, an inverting input terminal (−) that receives the second measurement signal VINN1, and an output terminal that outputs the second comparison signal VOUTP1. Although it is described as an example in the present embodiment that a comparator having a 2-input structure is included, the present disclosure is not necessarily limited thereto, and a comparator having a 4-input structure may be included.

The second counter 187 may generate a count signal, which corresponds to the difference in voltage levels between the third and fourth pixel signals VPX2 and VPX3, as the second depth information signal DOUT1 on the basis of the second comparison signal VOUTP1 and the clock signal CLK.

Figure 6:
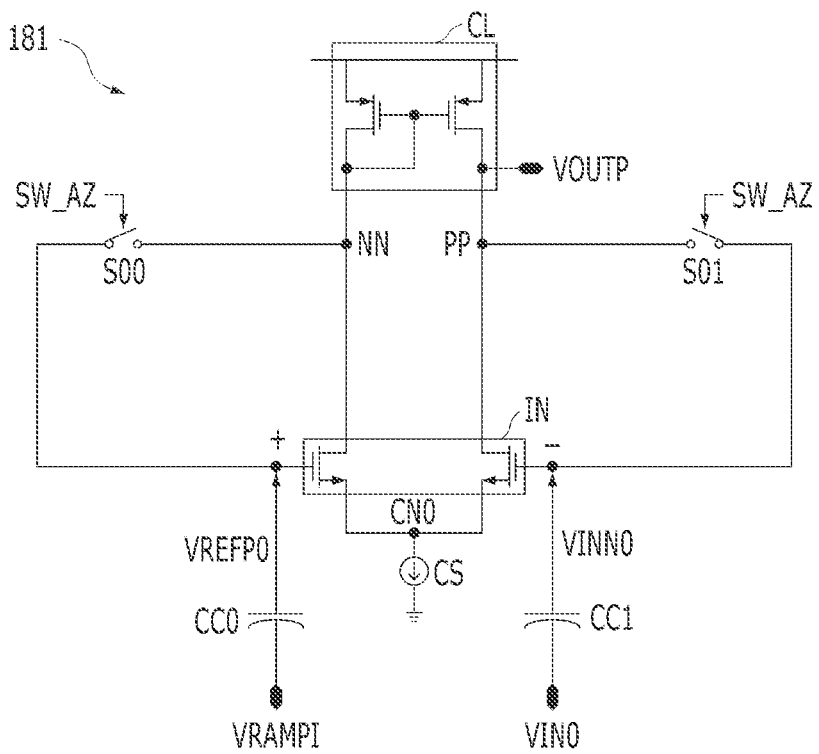
FIG. 6 is a circuit diagram illustrating a first sampling element, a second sampling element, and a comparator illustrated in FIG. 5.

FIG. 6 is a circuit diagram illustrating the first sampling element CC0, the second sampling element CC1, and the first comparator 181 illustrated in FIG. 5.

Referring to FIG. 6, the first sampling element CC0 may output the first ramp signal VREFP0 having the same waveform as the reference ramp signal VRAMPI to the non-inverting input terminal (+) of the first comparator 181.

The second sampling element CC1 may generate the first measurement signal VINN0, which corresponds to the difference in voltage levels between the first and second pixel signals VPX0 and VPX1, according to the first target signal VIN0.

The first comparator 181 may include a current supply circuit CL, an input circuit IN, a sink circuit CS, a first switch S00, and a second switch S01.

The current supply circuit CL may be coupled between a high voltage terminal and a pair of output terminals NN and PP.

The input circuit IN may be coupled between the pair of output terminals NN and PP and a common node CN0. The input circuit IN may receive the first measurement signal VINN0 and the first ramp signal VREFP0. For example, the input circuit IN may include a first input element and a second input element. The first input element may be coupled between a first output terminal PP of the pair of output terminals NN and PP and the common node CN0, and receive the first measurement signal VINN0. The second input element may be coupled between a second output terminal NN of the pair of output terminals NN and PP and the common node CN0, and receive the first ramp signal VREFP0.

The sink circuit CS may be coupled between the common node CN0 and a low voltage terminal, e.g., a ground voltage terminal.

The first switch S00 may be coupled between the non-inverting input terminal (+) and the second output terminal NN. For example, the first switch S00 may precharge the non-inverting input terminal (+) to a predetermined voltage level VAZ during the auto-zeroing period on the basis of a switch control signal SW_AZ. The predetermined voltage level VAZ may correspond to a gate-source voltage Vgs of a diode-connected PMOS transistor included in the current supply circuit CL.

The second switch S01 may be coupled between the inverting input terminal (−) and the first output terminal PP. For example, the second switch S01 may precharge the inverting input terminal (−) to the predetermined voltage level VAZ during the auto-zeroing period on the basis of the switch control signal SW_AZ.

Hereinafter, an operation of the image sensor 100 according to the present embodiment, which has the above-described configuration, is described with reference to FIGS. 7 to 9.

Figure 7:
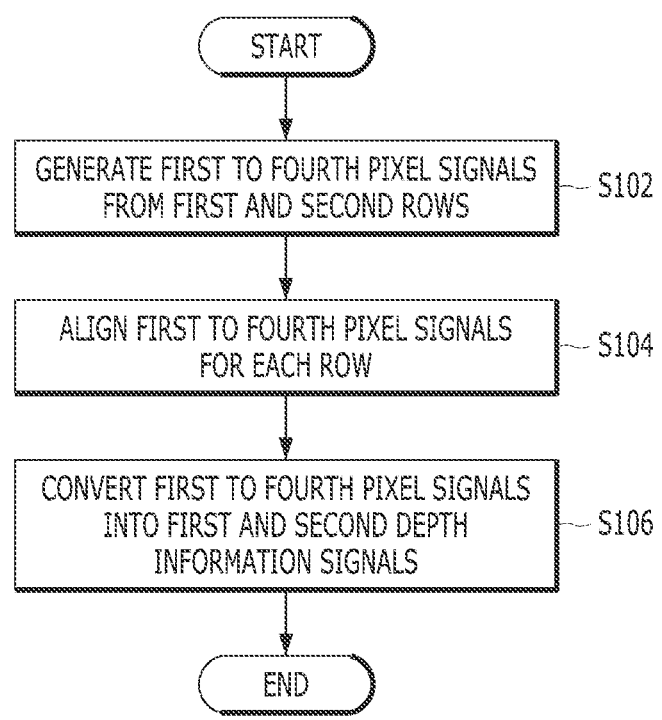
FIGS. 7 to 9 are diagrams illustrating an operation of the image sensor illustrated in FIG. 1 in accordance with an embodiment of the present disclosure.

FIG. 7 is a flowchart illustrating an operation of the image sensor 100 in accordance with an embodiment of the present disclosure.

Referring to FIG. 7, the image sensor 100 may simultaneously read out pixel signals from two rows in a structure in which two pixel signals are converted into one depth information signal through one A/D conversion operation.

In operation S102, the pixel array 150 may generate the first and second pixel signals VPX0 and VPX1 respectively from the first and second pixels TAP0A and TAP0B arranged in the first row, and generate the third and fourth pixel signals VPX2 and VPX3 from the third and fourth pixels TAP1A and TAP1B arranged in the second row, during a first unit row time. The first pixel signal VPX0 may be outputted through the first column line COL0, the second pixel signal VPX1 may be outputted through the third column line COL2, the third pixel signal VPX2 may be outputted through the second column line COL1, and the fourth pixel signal VPX3 may be outputted through the fourth column line COL3.

In operation S104, the signal aligner 160 may align the first to fourth pixel signals VPX0 to VPX3 for each row on the basis of the first and second control signals SC<0:1>, and generate the first to fourth alignment signals VP0 to VA3. For example, the first alignment circuit 161 may align the first pixel signal VPX0 and the second pixel signal VPX1 to a first stage corresponding to the first column, and align the third pixel signal VPX2 and the fourth pixel signal VPX3 to a second stage corresponding to the second column. The first pixel signal VPX0 is outputted through the first column line COL0, and the second pixel signal VPX1 is outputted through the third column line COL2. The third pixel signal VPX2 is outputted through the second column line COL1, and the fourth pixel signal VPX3 is outputted through the fourth column line COL3. The first alignment circuit 161 may sequentially output the first alignment signal VA0 corresponding to the first pixel signal VPX0 and the second alignment signal VA1 corresponding to the second pixel signal VPX1 to the first output node NN0, and sequentially output the third alignment signal VA2 corresponding to the third pixel signal VPX2 and the fourth alignment signal VA3 corresponding to the fourth pixel signal VPX3 to the second output node NN1, on the basis of the first and second control signals SC<0:1>.

The signal converter 180 may generate the first target signal VIN0 on the basis of the first and second alignment signals VA0 and VA1, and generate the second target signal VIN1 on the basis of the third and fourth alignment signals VA2 and VA3. In operation S106, the signal converter 180 may generate the first depth information signal DOUT0 on the basis of the first target signal VIN0 and the reference ramp signal VRAMPI, and generate the second depth information signal DOUT1 on the basis of the second target signal VIN1 and the reference ramp signal VRAMPI. The first depth information signal DOUT0 may correspond to a difference between the first and second pixel signals VPX0 and VPX1, and the second depth information signal DOUT1 may correspond to a difference between the third and fourth pixel signals VPX2 and VPX3.

Figure 8:
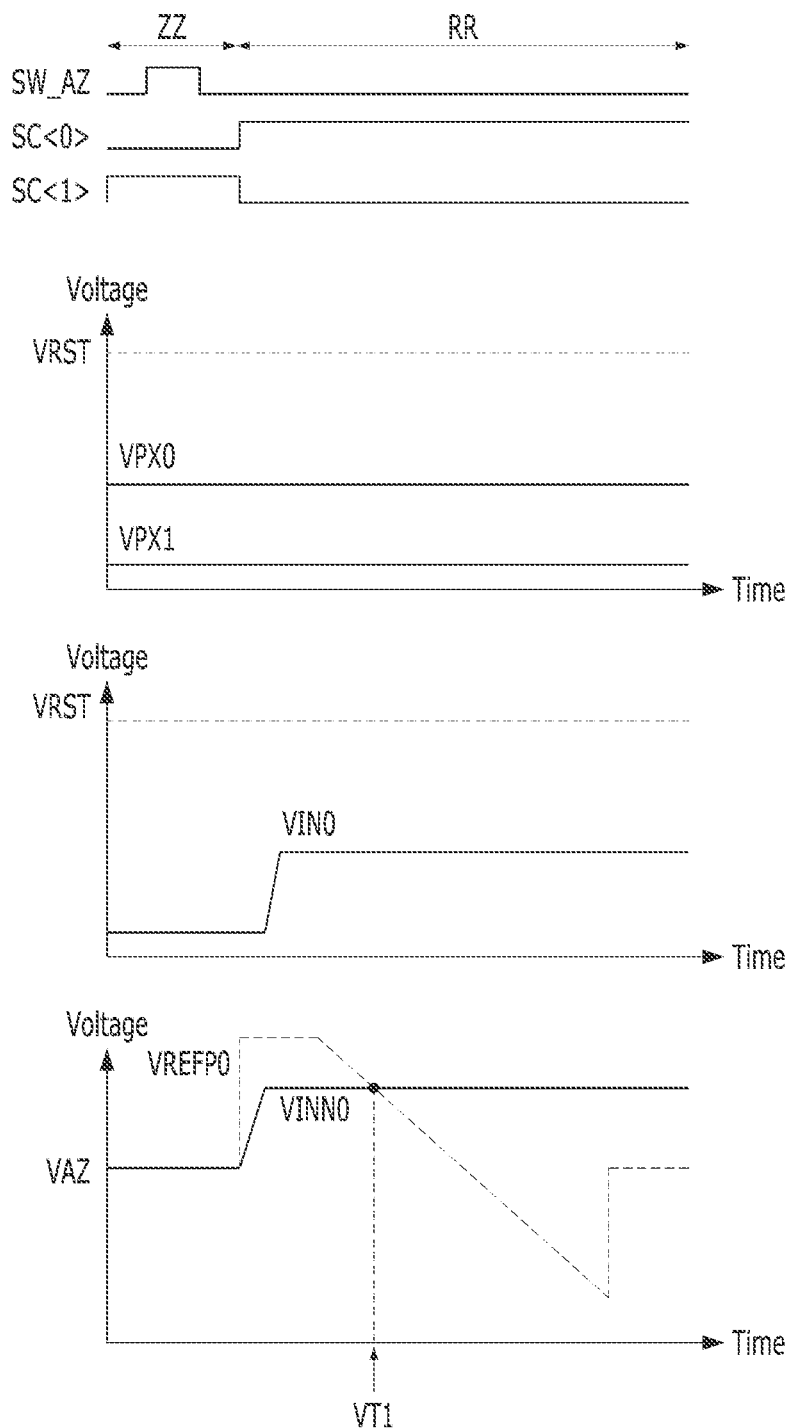
Figure 9:
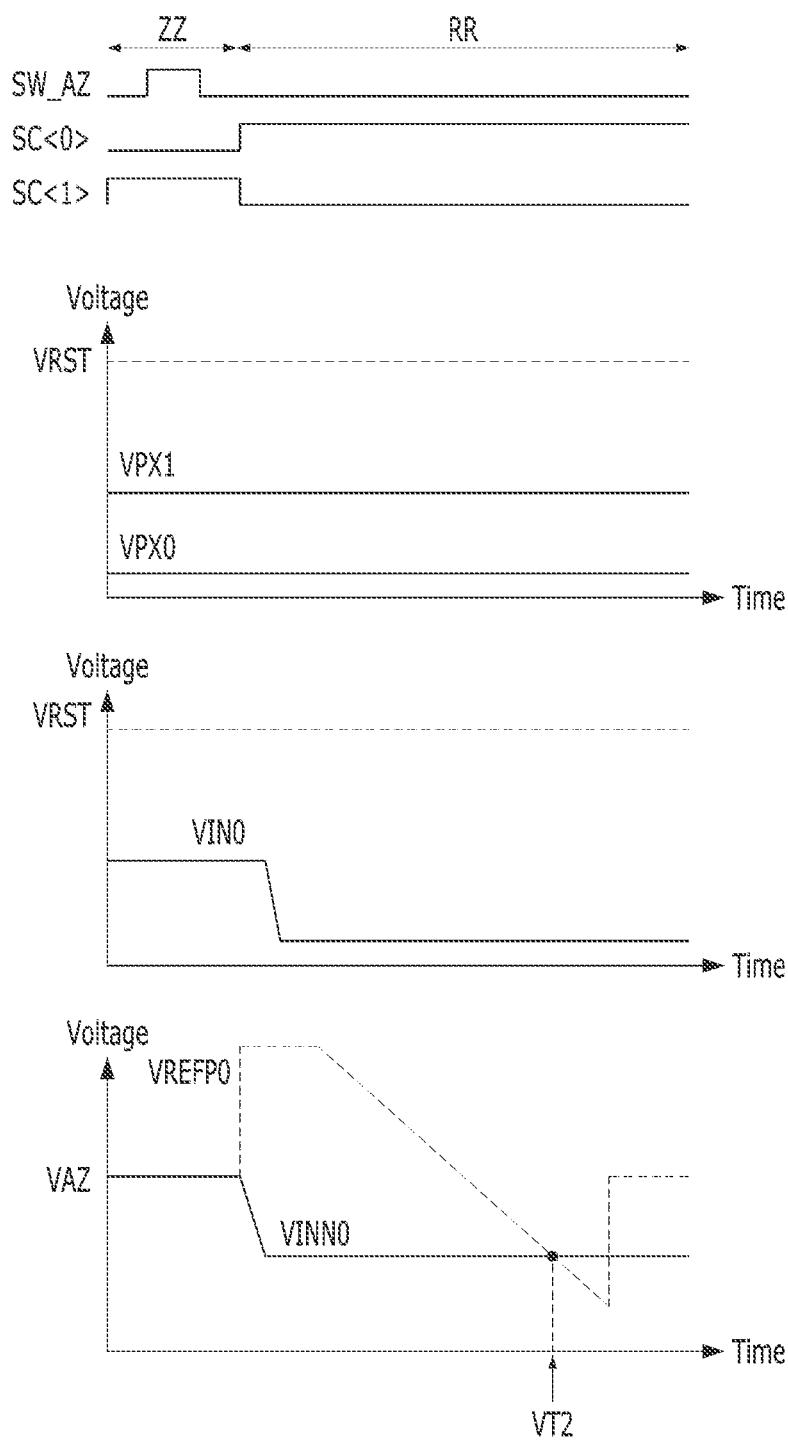

FIGS. 8 and 9 are timing diagrams for additionally describing the operation of the image sensor 100 in accordance with an embodiment of the present disclosure.

FIG. 8 is a timing diagram illustrating a case where a voltage level of the first pixel signal VPX0 is higher than that of the second pixel signal VPX1.

Referring to FIG. 8, the second switch SW1 may output the second pixel signal VPX1 to the first output node NN0 on the basis of the second control signal SC<1> during a first auto-zeroing period ZZ of the first unit row time, and then output the first pixel signal VPX0 to the first output node NN0 on the basis of the first control signal SC<0> during a first conversion period RR of the first unit row time. As illustrated in FIG. 8, the first unit row time includes the first auto-zeroing period ZZ and the first conversion period RR. The first target signal VIN0 generated through the first output node NN0 may have a voltage level corresponding to the second pixel signal VPX1 during the first auto-zeroing period ZZ, and have a voltage level corresponding to the first pixel signal VPX0 during the first conversion period RR. The voltage level corresponding to the second pixel signal VPX1 and the voltage level corresponding to the first pixel signal VPX0 may be lower than a reset level VRST. The reset level VRST may correspond to a high voltage supplied through the first high voltage terminal. The first measurement signal VINN0 may have a voltage level corresponding to a predetermined voltage VAZ during the first auto-zeroing period ZZ. The first measurement signal VINN0 may have a voltage level on which the predetermined voltage VAZ and the difference in voltage levels between the first and second pixel signals VPX0 and VPX1 are reflected during the first conversion period RR, that is, VAZ+(VPX0−VPX1). For example, the first measurement signal VINN0 may increase by an amount of change in a voltage level of the first target signal VIN0, that is, VPX0−VPX1, from the predetermined voltage VAZ during the first conversion period RR.

The first comparator 181 may compare the first ramp signal VREFP0 with the first measurement signal VINN0, and allow the first comparison signal VOUTP to transition at a point of time VT1 at which the first ramp signal VREFP0 and the first measurement signal VINN0 have the same voltage level as a result of the comparison, during the first conversion period RR.

The first counter 183 may generate the count signal, which corresponds to the difference in voltage levels between the first pixel signal VPX0 and the second pixel signal VPX1, as the first depth information signal DOUT0 on the basis of the first comparison signal VOUTP0 and the clock signal CLK.

FIG. 9 is a timing diagram illustrating a case where a voltage level of the second pixel signal VPX1 is higher than that of the first pixel signal VPX0.

Referring to FIG. 9, the second switch SW1 may output the second pixel signal VPX1 to the first output node NN0 on the basis of the second control signal SC<1> during the first auto-zeroing period ZZ of the first unit row time, and then output the first pixel signal VPX0 to the first output node NN0 on the basis of the first control signal SC<0> during the first conversion period RR of the first unit row time. The first target signal VIN0 generated through the first output node NN0 may have a voltage level corresponding to the second pixel signal VPX1 during the first auto-zeroing period ZZ, and have a voltage level corresponding to the first pixel signal VPX0 during the first conversion period RR. The voltage level corresponding to the second pixel signal VPX1 and the voltage level corresponding to the first pixel signal VPX0 may be lower than the reset level VRST. The reset level VRST may correspond to the high voltage supplied through the first high voltage terminal. The first measurement signal VINN0 may have a voltage level corresponding to the predetermined voltage VAZ during the first auto-zeroing period ZZ. The first measurement signal VINN0 may have a voltage level on which the predetermined voltage VAZ and the difference in voltage levels between the first and second pixel signals VPX0 and VPX1 are reflected during the first conversion period RR, that is, VAZ−(VPX1−VPX0). For example, the first measurement signal VINN0 may decrease by an amount of change in a voltage level of the first target signal VIN0, that is, VPX1–VPX0, from the predetermined voltage VAZ during the first conversion period RR.

The first comparator 181 may compare the first ramp signal VREFP0 with the first measurement signal VINN0, and allow the first comparison signal VOUTP to transition at a point of time VT2 at which the first ramp signal VREFP0 and the first measurement signal VINN0 have the same voltage level as a result of the comparison, during the first conversion period RR.

The first counter 183 may generate the count signal, which corresponds to the difference in voltage levels between the first pixel signal VPX0 and the second pixel signal VPX1, as the first depth information signal DOUT0 on the basis of the first comparison signal VOUTP0 and the clock signal CLK.

As described above, during the first unit row time, the first and second pixel signals VPX0 and VPX1 corresponding to the first row of the pixel array 150 may be outputted to the first output node NN0, and accordingly, the first target signal VIN0 and the first measurement signal VINN0 may be generated. At the same time, although not illustrated, during the first unit row time, the third and fourth pixel signals VPX2 and VPX3 corresponding to the second row of the pixel array 150 may be outputted to the second output node NN1, and the second target signal VIN1 and the second measurement signal VINN1 may be generated according to the above-described operation.

According to an embodiment of the present disclosure, a plurality of rows may be simultaneously read out in a structure in which two pixel signals are converted into a single depth information signal through one A/D conversion operation, which makes it possible to reduce readout time.

According to an embodiment of the present disclosure, as the readout time is reduced, a frame rate may be improved.

While the present disclosure has been illustrated and described with respect to specific embodiments, the disclosed embodiments are provided for the description, and not intended to be restrictive. Further, it is noted that the present disclosure may be achieved in various ways through substitution, change, and modification that fall within the scope of the following claims, as those skilled in the art will recognize in light of the present disclosure. Furthermore, the embodiments may be combined to form additional embodiments.

What is claimed is:

1. An image sensor comprising:
   first and second pixels arranged in a first row, and suitable for outputting first and second pixel signals through first and third column lines, respectively, during a unit row time;
   third and fourth pixels arranged in a second row different from the first row, and suitable for outputting third and fourth pixel signals through second and fourth column lines, respectively, during the unit row time;
   an alignment circuit suitable for aligning the first to fourth pixel signals for each of the first and second rows, and outputting first to fourth alignment signals, according to a plurality of control signals;
   a first signal conversion circuit suitable for receiving the first and second alignment signals and generating a first depth information signal, which corresponds to a difference in voltage levels between the first and second alignment signals, through one first analog-to-digital (A/D) conversion operation; and
   a second signal conversion circuit suitable for receiving the third and fourth alignment signals and generating a second depth information signal, which corresponds to a difference in voltage levels between the third and fourth alignment signals, through one second A/D conversion operation.

2. The image sensor of claim 1, wherein the one first A/D conversion operation includes one comparison operation,
   wherein the one comparison operation compares a reference signal with a signal which corresponds to the difference in voltage levels between the first and second alignment signals.

3. The image sensor of claim 1, wherein the one second A/D conversion operation includes one comparison operation,
   wherein the one comparison operation compares a reference signal with a signal which corresponds to the difference in voltage levels between the third and fourth alignment signals.

4. The image sensor of claim 1, wherein the alignment circuit outputs the first and second alignment signals, which correspond to the first and second pixel signals, respectively, to the first signal conversion circuit, and outputs the third and fourth alignment signals, which correspond to the third and fourth pixel signals, respectively, to the second signal conversion circuit.

5. The image sensor of claim 1, wherein the alignment circuit includes:
   a first switch coupled between the first column line and a first output node, and suitable for selectively coupling the first column line to the first output node according to a first control signal;
   a second switch coupled between the third column line and the first output node, and suitable for selectively coupling the third column line to the first output node according to a second control signal;
   a third switch coupled between the second column line and a second output node, and suitable for selectively coupling the second column line to the second output node according to the first control signal; and
   a fourth switch coupled between the fourth column line and the second output node, and suitable for selectively coupling the fourth column line to the second output node according to the second control signal.

6. The image sensor of claim 5, wherein the first to fourth column lines extend along a column direction among arrangement directions of the first to fourth pixels, are sequentially arranged along a row direction among the arrangement directions of the first to fourth pixels, and the first to fourth switches are sequentially arranged along the row direction.

7. The image sensor of claim 5, wherein the unit row time includes a conversion period and an auto-zeroing period,
   the first switch outputs the first pixel signal to the first output node during the conversion period according to the first control signal,
   the second switch outputs the second pixel signal to the first output node during the auto-zeroing period according to the second control signal,
   the third switch outputs the third pixel signal to the second output node during the conversion period according to the first control signal, and
   the fourth switch outputs the fourth pixel signal to the second output node during the auto-zeroing period according to the second control signal.

8. The image sensor of claim 7, wherein the auto-zeroing period precedes the conversion period.

9. The image sensor of claim 5, wherein the alignment circuit further includes:

a first current source coupled to the first column line;
a second current source coupled to the second column line;
a third current source coupled to the third column line; and
a fourth current source coupled to the fourth column line.

10. The image sensor of claim 5, wherein the alignment circuit further includes:
a first current source coupled to the first output node; and
a second current source coupled to the second output node.

11. The image sensor of claim 1, wherein the first signal conversion circuit includes:
a first sampling element suitable for sampling a ramp signal;
a second sampling element suitable for sampling the first and second alignment signals as a first measurement signal;
a first comparator suitable for comparing the ramp signal with the first measurement signal, and generating a first comparison signal corresponding to a result of the comparison; and
a first counter suitable for generating a count signal, which corresponds to a voltage level of the first measurement signal, as the first depth information signal according to the first comparison signal and a clock signal.

12. The image sensor of claim 11, wherein the first measurement signal has a voltage level on which the difference in voltage levels between the first alignment signal and the second alignment signal is reflected.

13. The image sensor of claim 1, wherein the second signal conversion circuit includes:
a third sampling element suitable for sampling a ramp signal;
a fourth sampling element suitable for sampling the third and fourth alignment signals as a second measurement signal;
a second comparator suitable for comparing the ramp signal with the second measurement signal, and generating a second comparison signal corresponding to a result of the comparison; and
a second counter suitable for generating a count signal, which corresponds to a voltage level of the second measurement signal, as the second depth information signal according to the second comparison signal and a clock signal.

14. The image sensor of claim 13, wherein the second measurement signal has a voltage level on which the difference in voltage levels between the third alignment signal and the fourth alignment signal is reflected.

15. An operating method of an image sensor including first to fourth pixels arranged between first to fourth column lines sequentially arranged along a row direction, and first to fourth switches sequentially arranged along the row direction, the operating method comprising:
outputting, by the second switch, a second pixel signal, which is outputted through the third column line, to a first output node, and outputting, by the fourth switch, a fourth pixel signal, which is outputted through the fourth column line, to a second output node, during an auto-zeroing period of a unit row time; and
outputting, by the first switch, a first pixel signal, which is outputted through the first column line, to the first output node, and outputting, by the third switch, a third pixel signal, which is outputted through the second column line, to the second output node, during a conversion period of the unit row time.

16. The operating method of claim 15, further comprising generating a first depth information signal corresponding to a difference in voltage levels between the first and second pixel signals and a second depth information signal corresponding to a difference in voltage levels between the third and fourth pixel signals, during the conversion period.

17. The operating method of claim 16, wherein the generating of the first depth information signal includes:
generating a first measurement signal, which corresponds to the difference in voltage levels between the first and second pixel signals, according to the second pixel signal and the first pixel signal sequentially outputted to the first output node;
comparing the first measurement signal with a ramp signal to generate a first comparison signal corresponding to a result of the comparison; and
generating the first depth information signal, which corresponds to a voltage level of the first measurement signal, according to the first comparison signal and a clock signal.

18. The operating method of claim 16, wherein the generating of the second depth information signal includes:
generating a second measurement signal, which corresponds to the difference in voltage levels between the third and fourth pixel signals, according to the fourth pixel signal and the third pixel signal sequentially outputted to the second output node;
comparing the second measurement signal with a ramp signal to generate a second comparison signal corresponding to a result of the comparison; and
generating the second depth information signal, which corresponds to a voltage level of the second measurement signal, according to the second comparison signal and a clock signal.

19. The operating method of claim 15, wherein the auto-zeroing period precedes the conversion period.

20. A system comprising:
an object;
an image sensor optically coupled to the object and suitable for generating first to fourth depth information signals indicating a distance from the object,
wherein the image sensor includes:
a pixel array including first to fourth pixels arranged between first and second rows and first to fourth columns, wherein the first and second pixels are arranged between the first row and the first and third columns and output first and second pixel signals through the first and third column lines, respectively, and wherein the third and fourth pixels are arranged between the second row and the second and fourth columns and output third and fourth pixel signals through the second and fourth column lines, respectively;
an alignment circuit suitable for aligning the first to fourth pixel signals based on each of the first and second rows, generating first to fourth alignment signals corresponding to the first to fourth pixel signals, respectively, outputting the second and fourth alignment signals in a first period, and outputting the first and third alignment signals in a second period after the first period;
a first signal conversion circuit suitable for receiving the first and second alignment signals, and converting the first and second alignment signals to generate a first depth information signal, which corresponds to a difference in voltage levels between the first and second alignment signals; and a second signal conversion circuit suitable for receiving the third and fourth alignment signals and converting the third and fourth alignment signals to generate a second depth information signal, which corresponds to a difference in voltage levels between the third and fourth alignment signals.

* * * * *